(12) United States Patent
Vigna et al.

(10) Patent No.: US 6,605,873 B1
(45) Date of Patent: Aug. 12, 2003

(54) INTEGRATED ELECTRONIC DEVICE COMPRISING A MECHANICAL STRESS PROTECTION STRUCTURE

(75) Inventors: Benedetto Vigna, Potenza (IT); Enrico Maria Alfonso Ravanelli, Monza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 445 days.

(21) Appl. No.: 09/205,668

(22) Filed: Dec. 4, 1998

(30) Foreign Application Priority Data

Dec. 5, 1997 (EP) .............................. 97830654

(51) Int. Cl.[7] .............................................. H01L 23/48
(52) U.S. Cl. ...................................................... 257/758
(58) Field of Search ........................................ 257/758

(56) References Cited

U.S. PATENT DOCUMENTS 5,751,065 A * 5/1998 Chittipeddi et al. ......... 257/758
5,900,668 A * 5/1999 Wollesen .................... 257/522

FOREIGN PATENT DOCUMENTS

| EP | 0 075 331 A2 | 3/1983 |
| GB | 2 258 945 A | 2/1993 |
| JP | 02 068944 | 3/1990 |

* cited by examiner

*Primary Examiner*—Douglas A. Wille
(74) *Attorney, Agent, or Firm*—Lisa K. Jorgenson; Robert Iannucci; Seed IP Law Group PLLC

(57) ABSTRACT

The integrated electronic device comprises a protection structure of metal, extending vertically and laterally to and along a predominant part of the periphery of an electronic component integrated underneath the pad region. The protection structure comprises a substantially annular region formed from a second metal layer and absorbing the stresses exerted on the pad during wire bonding. The annular region may be floating or form part of the path connecting the pad to the electronic component.

18 Claims, 3 Drawing Sheets

INTEGRATED ELECTRONIC DEVICE COMPRISING A MECHANICAL STRESS PROTECTION STRUCTURE

TECHNICAL FIELD

The invention relates to an integrated electronic device comprising a mechanical stress protection structure.

BACKGROUND OF THE INVENTION

As is known, the techniques of advanced photolithography (such as ultraviolet electromagnetic radiation, X rays) allow integration of millions of transistors and electronic components of circuits on the scale of ULSI in areas of silicon of several square millimeters. This very high integration level enables the circuit functionalities of the devices to be increased but also involves an increase in the number of pins and corresponding contact pads required for connection of the integrated device to the system which cooperates therewith, such as extremely fast microprocessors with a large number of bits.

Because of the increase in the pad number and the corresponding reduction of the device minimum dimensions, the space required for the interconnections becomes an increasingly large fraction of the area of the chip. To avoid this problem, the actual dimensions of the bonding pads and the space between them would have to reduce; there are, however, limiting factors (minimum dimensions of the bonding wire; alignment mechanical tolerances of the wires on the pads) which cause the minimum dimension areas of the pads to be of some tens of microns. These dimensions, on the other hand, are particularly large if compared to the minimum lithographic dimensions, of the order of tenths of a micron.

Consequently, in case of integrated devices with a large number of pads, the area intended for the interconnections represents a high percentage of the chip total area and furthermore, sometimes, the total dimensions of the chip become unacceptable; in this situation it would be appropriate to integrate part of the electronic devices in the zones underneath the pads. This is rarely possible, however, in that the mechanical deformations induced in the area of the pads during the wire bonding phase expose the devices underneath to not insignificant problems of reliability.

In particular, during wire bonding, mechanical stresses may occur on the metal/dielectric interfaces because of the different Young and rigidity moduli of the materials and these stresses may cause delaminations and/or fractures of the different layers and/or mechanical compression states. These phenomena may give rise to anomalies in the correct operation of the device. For example, delaminations and/or fractures may cause problems of current leakage, induced surface contamination, changes of parasitic thresholds; the state of stress may locally alter the crystallographic orientation of the single-crystal lattice of the silicon, inducing variations in the electrical parameters of the components (variations in density of surface layers and hence a change in the natural threshold of MOS devices and of the beta parameter of bipolar transistors, etc.).

Integration underneath the pad would be desirable, for example, in case of integration of electrostatic discharge protection circuits which act only during chip handling and are also of considerable size compared with the other circuits, thus occupying a not insignificant area of silicon which could otherwise be used for various circuit functions. Furthermore, integration underneath the pads also appears advantageous for extremely fast devices in which the parasitic resistances and capacitances associated with the interconnections limit the maximum use speed of the device; in this case, therefore, it is desirable to reduce the interconnection length as much as possible, as is possible in case of components integrated directly underneath the respective pads, so that the parasitic components can be minimized and the integrated device speed performance consequently optimized.

SUMMARY OF THE INVENTION

An object of the invention is therefore to provide a protection structure which enables active devices to be integrated underneath the pads.

According to one aspect of the present invention, an integrated electronic device is provided, as defined, for example, in claim 1.

BRIEF DESCRIPTION OF THE DRAWINGS

For an understanding of the invention, various preferred embodiments will now be described, purely by way of non-exhaustive example and with reference to the accompanying drawings.

DETAILED DESCRIPTION OF THE INVENTION

Figure 1:
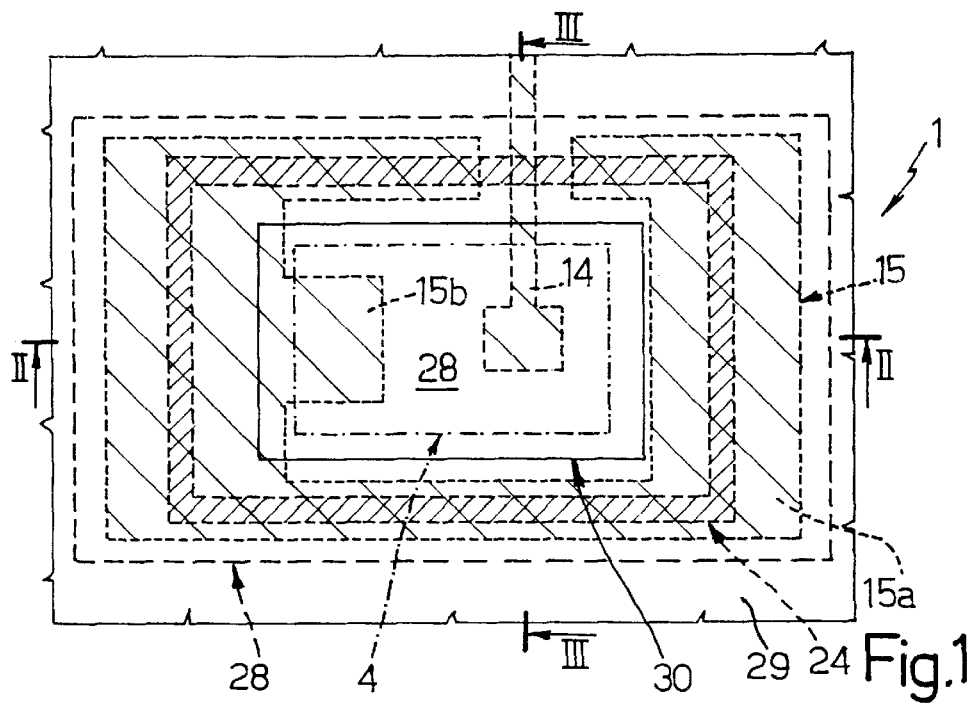
FIG. 1 shows a top view of a first embodiment of the device.
Figure 2:
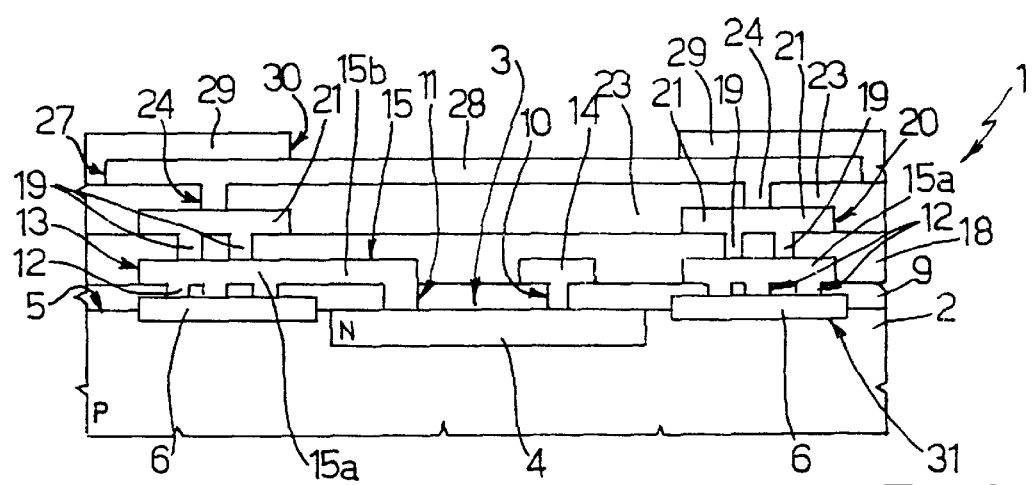
FIG. 2 is a cross-section of FIG. 1 taken along plane II—II.
Figure 3:
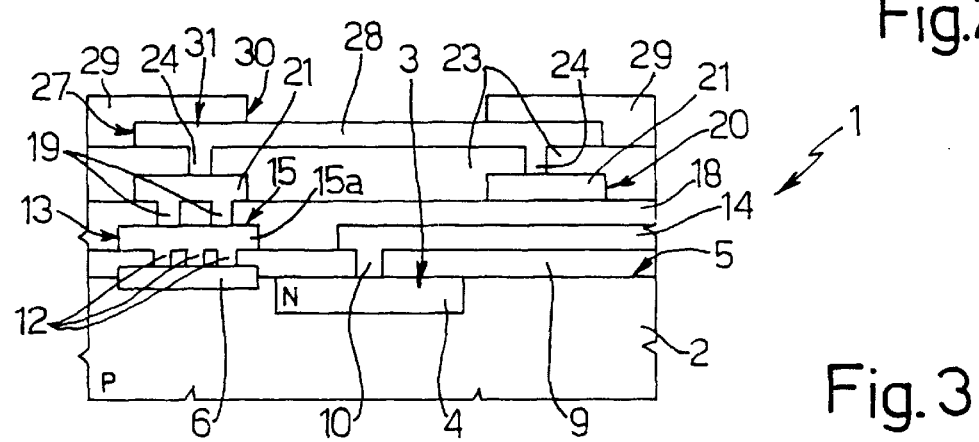
FIG. 3 is a cross-section of FIG. 1 taken along plane III—III.

With reference to FIGS. 1–3, an integrated device 1 comprises a substrate 2 of semiconductor material (silicon) of a first conductivity type, P for example, housing an electronic component 3 including a well 4 of a second conductivity type, N-type in the present case. The substrate 2 forms a surface 5 across which a layer of field oxide 6 has been grown, surrounding the component 3 on all sides. Various superimposed, dielectric material layers and various metal levels, suitably shaped, extend on top of the surface 5. In particular, as shown in FIGS. 2 and 3, immediately on top of the surface 5 is a first dielectric layer 9; on top of layer 9 is the first metal level (or layer) 13 forming an interconnection line 14 and an interconnection and relief region 15; the interconnection line 14 extends from the component 3 (to which it is electrically connected by means of a portion 10 extending through the first dielectric layer 9) to allow electrical connection to the other components (not shown) of the device 1; the interconnection and relief region 15, extending on top of field oxide layer 6, has a peripheral portion 15a extending in a substantially C-shape (as can be seen in FIG. 1) to surround, in plan view, the region of component 3 and a connection portion 15b extending towards the inside the C. The connection portion 15b is connected to the component 3 by a section 11 passing through the first dielectric layer 9 while the peripheral portion 15a has sections 12 extending through first dielectric layer 9 as far as field oxide layer 6.

A second dielectric layer 18 extends on top of first metal level 13 and has openings housing C-shaped portions 19 formed starting from a second metal level 20 also forming an annular region 21. In the vertical direction, annular region 21 is substantially aligned with the peripheral portion 15a of interconnection and relief region 15 to which it is electrically and mechanically connected by means of portions 19. A third dielectric layer 23 extends on top of second metal level and has an annular opening housing an annular portion 24 (the shape of which can be seen in FIG. 1) formed starting from a third metal level 27 also forming a pad region 28 of the device. Pad region 28 is rectangular (see FIG. 1 in particular), extends on top of third metal layer 23 and is electrically connected to annular bearing region 21, near its periphery, by means of annular portion 24. Finally, a passivation layer 29 covers the entire device 1 with the exception of an opening 30 at pad 28, to permit bonding of the wire(s).

As will be noted, at the bottom, pad 28 is connected to a bearing structure 31 comprising regions 21, 15a and portions 24, 19, 12 and extending vertically entirely outside the component 3; in particular, on one side, the bearing structure 31 electrically connects the pad 28 to component 3 through portion 15b and on the other side it acts to concentrate the mechanical stress to which the pad is subjected during wire bonding on a limited peripheral area not containing electronic components or conductive regions, but only field oxide layer 6. In this way the stress exerted on component 3 during wire bonding is considerably reduced; furthermore, there are no dielectric/metal interfaces between second and third metal layers 18, 23 on top of component 3; consequently, delamination problems are eliminated in this zone.

Figure 4:
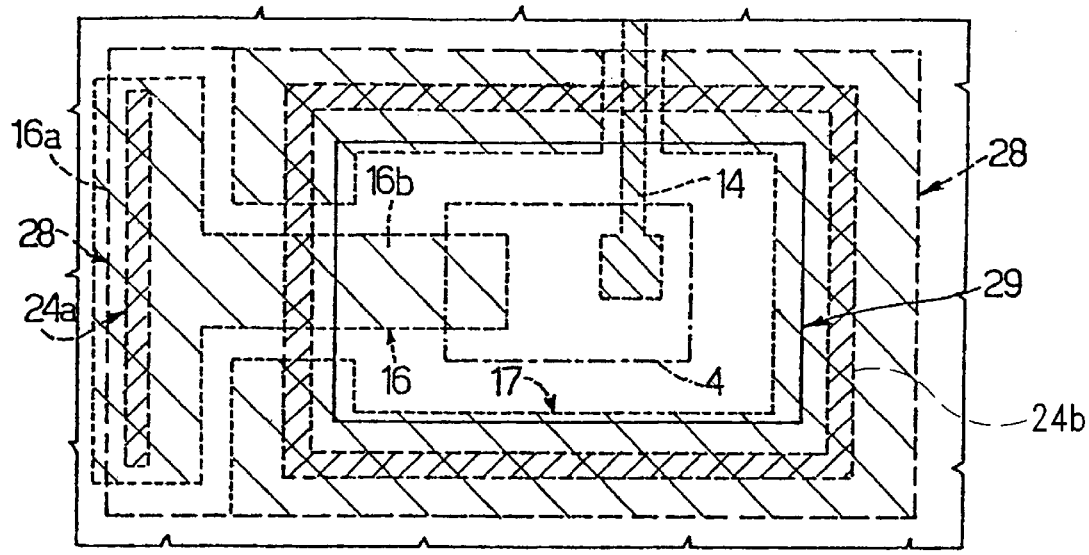
FIG. 4 shows a top view of a second embodiment of the device.
Figure 5:
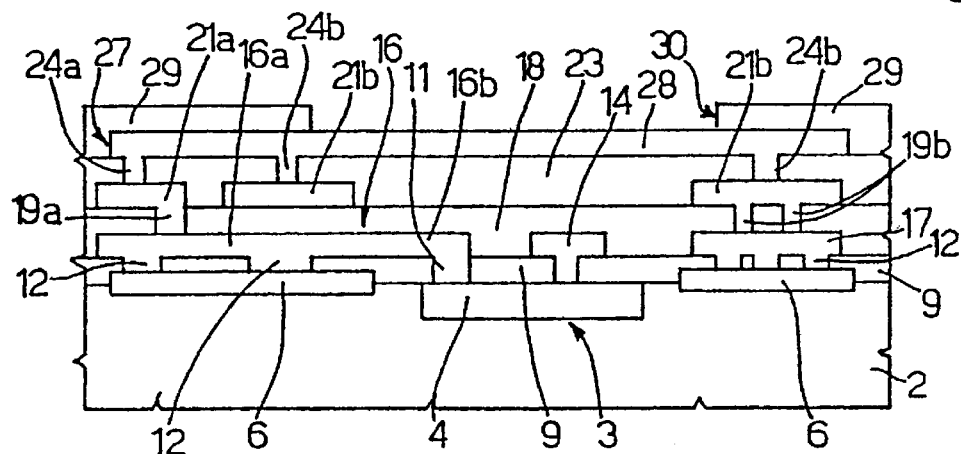
FIG. 5 is a cross-section of FIG. 4 taken along plane V—V.

According to the embodiment of FIGS. 4 and 5, the stress relief structure and the electrical connection structure are separate even though electrically connected. In particular, in addition to connection line 14, first metal level 13 forms an electrical connection region 16 and a stress relief region 17 which are separate from each other. In particular, electrical connection region 16, connected to component 3 by portion 11, extends on top of first dielectric layer 9 so as to have a T-shape when viewed from the top, as can be seen in FIG. 4, with the cross arm of the T (section 16a) extending in remote position with respect to component 3 and the leg of the T (section 16b) extending from arm 16a as far as component 3. In contrast, when viewed from the top, stress relief region 17 is C-shaped to surround, at a distance, component 3 apart from the zone in which the leg 16b of the T-shaped electrical connection region 16 extends.

Furthermore, in FIGS. 4 and 5 the second metal level comprises two distinct regions: an intermediate region 21a, extending on top of cross arm 16a of electrical connection region 16 and electrically connected thereto by a portion 19a extending in an opening of second dielectric layer 18; and an annular region 21b which completely surrounds component 3 when viewed from the top. Annular region 21b has portions directly resting on the stress relief region 17 thanks to portions 19b extending through openings in second dielectric layer 18 and having the same C-shape as the stress relief region 17; thus annular region 21b rests on region 17 for a significant portion of its extension.

Finally, in FIGS. 4 and 5, third dielectric layer 23 has openings housing an elongated portion 24a and an annular portion 24b formed from the third metal layer 27; elongated portion 24a (the shape of which can be seen in FIG. 4, as can that of portion 24b) ensures an electrical connection of pad 28 to intermediate region 21a and thus to electrical connection region 16 and component 3, whereas portion 24b of metal layer 27 ensures mechanical connection of pad 28 to annular region 21b and stress relief region 17.

In this way, the electrical connection path through regions 21a, 16a is external to the protection structure (comprising regions 21b and 17) and is thus only influenced in reduced manner by stresses exerted during wire bonding; on the other hand, since it is external to the device, protection structure considerably reduces the effect of mechanical stresses on component 3. Furthermore, here also, the interfaces between dielectric material and metal on top of component 3 are reduced to the minimum, reducing delamination problems.

Figure 6:
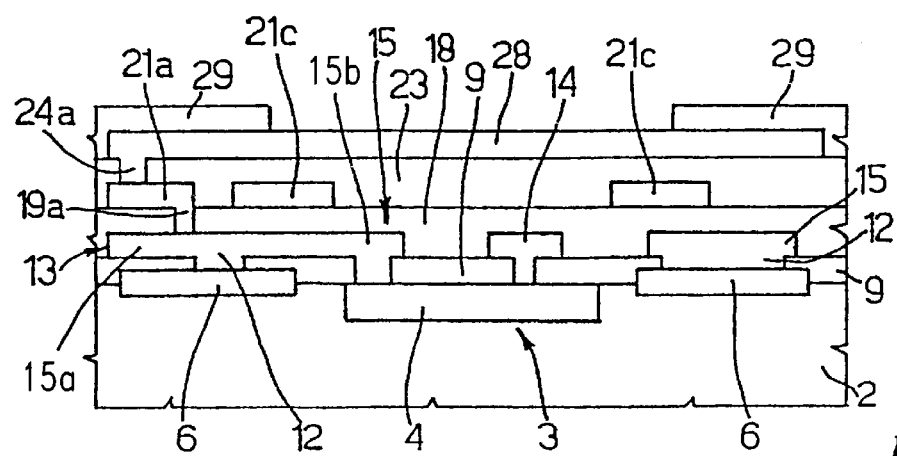
FIG. 6 shows a cross-section of a third embodiment of the device.

In the embodiment of FIG. 6 the protection structure is electrically floating. In detail, in the example shown, only intermediate region 21a has portions 19a for connection to the underlying metal level 13 and third metal level 27 forms only the portion 24a so as to allow electrical connection in a manner similar to that described with reference to FIGS. 4 and 5, but there are no connections (guaranteed by portions 24b and 19b in FIGS. 4 and 5) between annular region, denoted by 21c here, and pad 28 on one side and first metal level 13 on the other; furthermore, analogously to FIGS. 1–3, a single region 15 which annularly surrounds component 3 is present. Alternatively it is possible to separate region 15 into two regions for electrical connection and protection respectively, in a manner similar to regions 16 and 17 of FIGS. 4 and 5; in this case, in the embodiment of FIG. 6 and in contrast to FIGS. 4 and 5, the connection (portion 19b of FIG. 5) between region 17 and annular region 21c could be missing.

With the solution of FIG. 6 deformation of second and third dielectric layers in the central zones, above component 3, is reduced.

Figure 7:
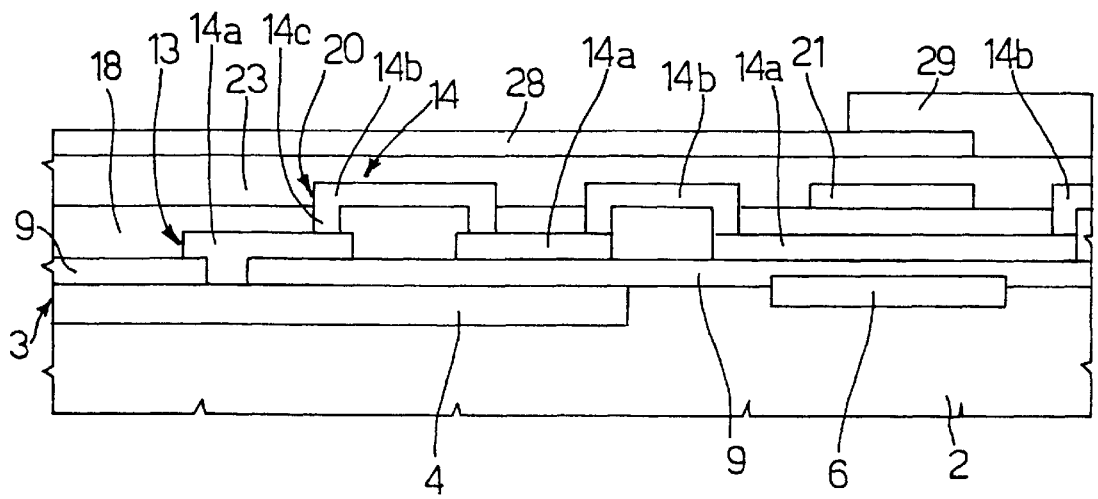
FIG. 7 shows a cross-section through the device according to a different embodiment of a detail of the device.

To reduce stresses induced by elongations of metal regions on dielectric layers, in all the embodiments, the interconnection lines (such as line 14 and portions 15b and 16b) may be formed by different sections belonging to two different metal levels instead of by continuous lines formed by a single metal. This solution is shown by way of example in FIG. 7 which relates to a possible implementation of interconnection line 14. As will be noted, in this case line 14 comprises portions 14a formed by first metal level 13 and portions 14b formed by second metal level 20; portions 14a and 14b are connected reciprocally at connection sections 35 formed by second metal level 20 and extending in openings of second dielectric layer 18. Furthermore, in the crossing zone between annular region 21 (or 21a, 21b) and interconnection line 14, a portion 14a is present and sections 19, 19b of second metal layer 20 are not present, to avoid electrical connections between interconnection line 14 and annular region 21 (or 21a, 21b).

In this way, long continuous metal sections are avoided which, in presence of mechanical or thermal stresses, may be subject to elastic deformations and produce delaminations and modifications to the physico/chemical properties of the structures.

Figure 8:
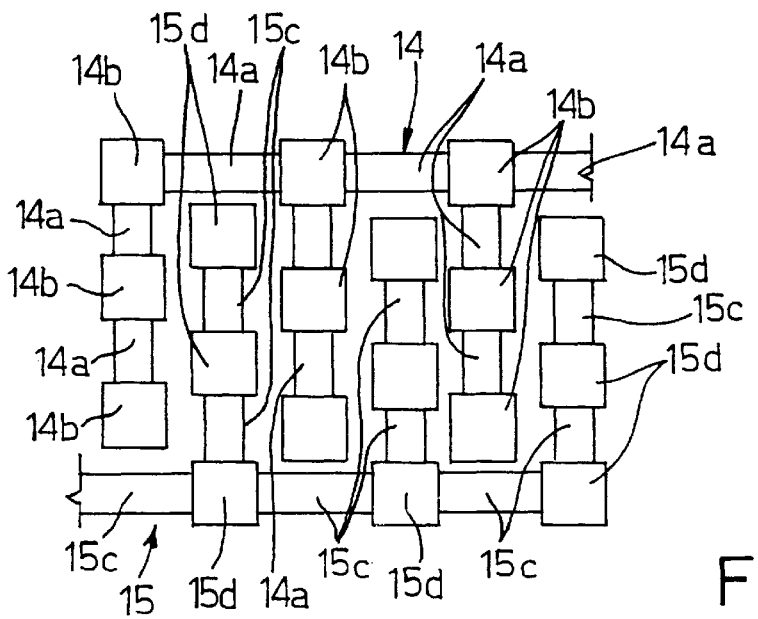
FIG. 8 shows a different embodiment of another detail.

To improve the properties and the mechanical strength of the device, in case of metallic regions of large dimensions in both surface directions it is possible to use interleaved comb configurations, as shown by way of example in FIG. 8. In this figure, the need was assumed for large areas for interconnection line 14 and portion 15*b* (16*b*) of region 15 (16) in contact with component 3. Here, both structures 14 and 15 comprise various sections formed on first and second metal levels 13, 20; in particular, in FIG. 8, and in a manner similar to FIG. 7, the portions of interconnection line 14 formed by first metal level 13 are denoted at 14*a*, the portions of interconnection line 14 formed by second metal level 20 at 14*b*; furthermore, the portions of region 15 formed on first metal level 13 are denoted at 15*c* and the portions of region 15 formed on second metal level 20 at 15*d*. Where provided by the layout, obviously, portions 14*a* and 15*c* formed by first metal level 13 are in electrical contact with the component underneath.

Thereby, length and width of each section of metal is limited, reducing elongations of the material in a stress state and stress propagation to remote points of the structure.

Device 1 is manufactured as follows. First dielectric layer 9 is deposited after forming field oxide layer 6 and component 3 in substrate 2; openings are formed in layer 9; first metal level 13 which will form portions 10–12 is deposited; first metal level 13 is shaped to form regions 14, 15 (or 16 and 17); second dielectric layer 18 is deposited; openings in layer 18 are formed; second metal level 20 which will form portions 19 (or 19*a*, 19*b*) is deposited; second metal level 20 is shaped to form annular region 21 (or 21*b*, with intermediate region 21*a*); third metal layer 23 is deposited; openings in layer 23 are formed; third metal level 27 that will form portions 24 (or 24*a*, 24*b*) is deposited; third metal level 27 is shaped to form pad region 28; passivation layer 29 is deposited and is removed at the pads; finally, bonding wires (not shown) are soldered.

The advantages of the described protection structure will be apparent from the above. In particular, it is stressed how it enables mechanical stresses and forces to be relieved laterally with respect to the electronic components even when they are integrated underneath the pad, thus allowing considerable savings of area, a reduction of parasitic components associated with the interconnections while the integrated device retains its reliability.

Furthermore, the described structures may be formed using procedures and machines that are conventional in the microelectronics industry and thus enabling the advantages thereof to be fully exploited as regards production costs and reliability.

Finally, it will be clear that many modifications and variants may be introduced to the device described and illustrated herein, all of which come within the scope of the invention as defined in the accompanying claims. In particular, it is stressed that the structure may also be formed in devices which also only use two metal levels, though the best protection may in some instances be obtained with three metal levels; furthermore, the structure may comprise regions with open or closed shape, provided that they surround the electronic component over a preponderant length of its perimeter; in general, the term annular region also includes shapes that are not circular but arranged according to the perimeter of polygons and discontinuous structures formed by sections arranged in any way to define, when considered together, a substantially annular shape. Furthermore, protective structure 31 may be inside or outside opening 30 of passivation layer and be formed by one or more metal levels; furthermore, it may be connected to and/or integral with the portions which connect the component to the pad or generally to the device connection lines, or be isolated therefrom. The integrated component underneath the pad may be of various types, such as a resistor, a diode or another electronic element. The two-dimensional comb-like structure shown in FIG. 8 and formed by different sections electrically connected may also be provided where an interleaved structure of two adjacent metallic regions is not required.

What is claimed is:

1. An integrated electronic device comprising:

a semiconductor material body;

an electronic component housed in said semiconductor material body and having a periphery;

an electrically insulating region extending on top of said semiconductor material body and including a central portion positioned directly above all of the electronic component;

a pad region extending on top of said electrically insulating region; and a protection structure of a material different from and extending into said electrically insulating region, said protection structure contacting and extending downward from portions of the pad region that are not directly above said electronic component, said protection structure including a peripheral portion extending around a predominant part of the central portion of the electrically insulating region.

2. A device according to claim 1 wherein said protection structure includes metal.

3. A device according to claim 1 wherein said peripheral portion of said protection structure is a substantially annular structure.

4. A device according to claim 3 wherein said peripheral portion is electrically connected to said pad region through metal portions extending through said insulating region.

5. A device according to claim 4 wherein said peripheral portion is electrically connected to said electronic component.

6. A device according to claim 3 wherein said peripheral portion is electrically floating.

7. A device according to claim 3, further comprising a metal interconnection region extending in said insulating region on top of said semiconductor material body and underneath said peripheral portion of the protective structure, wherein said metal interconnection region has a peripheral portion extending laterally to said electronic component and electrically connected to said pad region through the peripheral portion of the protective structure; and a connection portion extending from said peripheral portion of the metal interconnection region towards and in electrical contact with said electronic component.

8. A device according to claim 7, further comprising a field oxide region extending between said semiconductor material body and said peripheral portion of said metal interconnection region, and said peripheral portion of said metal interconnection region having bearing formations extending to said field oxide region.

9. A device according to claim 7 wherein said peripheral portion of said protection structure has first contact portions extending through said insulating region and in electrical contact with said metal interconnection region, said pad region having second contact portions extending peripherally through said insulating region and in electrical contact with said peripheral portion of said protection structure.

10. A device according to claim 7, further comprising an intermediate connection region extending externally to said peripheral portion of said protection structure, said intermediate connection region having a first contact portion extending through said insulating region and in electrical contact with said peripheral portion of said metal interconnection region, and said pad region having a second contact portion extending through said insulating region and in electrical contact with said intermediate connection region.

11. A device according to claim 10 wherein said pad region has a third contact portion extending through said insulating region and in electrical contact with said peripheral portion of said protection structure.

12. A device according to claim 1, further comprising electrical interconnection lines connected to said electronic component; said interconnection lines comprising discontinuous sections having respectively a first and a second distance from said semiconductor material body and connected to each other by intermediate portions extending through said insulating region.

13. A device according to claim 1, further comprising first and second conductive regions in contact with said electronic component and electrically insulated from each other, each of said conductive regions comprising a plurality of line portions, said line portions of the first conductive region electrically connected to each other and interleaved with said line portions of said second conductive region, each line portion of the first conductive region being formed by discontinuous sections having respectively a first and a second distance from said semiconductor material body and being connected to each other by intermediate portions extending through said insulating region.

14. An integrated electronic device comprising:

a semiconductor material body;

an electronic component positioned at a surface of the semiconductor material body;

a contact pad positioned above and electrically connected to the electronic component; and a protection structure having an annular peripheral portion in contact with and supporting the contact pad on the semiconductor material body.

15. The device of claim 14, further comprising an electrically insulating region completely covering the electronic component and surrounded by the peripheral portion of the protection structure.

16. The device of claim 14, wherein the protection structure electrically connects the contact pad to the electronic component.

17. The device of claim 14, further comprising field oxide regions contacting and supporting the protection structure on the semiconductor material body, the field oxide regions being positioned on opposite sides of the electronic component.

18. The device of claim 14, further comprising an intermediate connection region positioned externally to the peripheral portion of the protection structure, the intermediate connection region electrically connecting the contact pad to the electronic component.

* * * * *